(12) United States Patent
Afzali-Ardakani et al.

(10) Patent No.: US 7,176,484 B2
(45) Date of Patent: *Feb. 13, 2007

(54) USE OF AN ENERGY SOURCE TO CONVERT PRECURSORS INTO PATTERNED SEMICONDUCTORS

(75) Inventors: Ali Afzali-Ardakani, Yorktown Heights, NY (US); Hendrik Hamann, Mohegan Lake, NY (US); James A Lacey, Mahopac, NY (US); David R Medeiros, Ossining, NY (US); Praveen Chaudhari, Briarcliff Manor, NY (US); Robert Von Gutfeld, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

This patent is subject to a terminal disclaimer.

(21) Appl. No.: 10/314,607

(22) Filed: Dec. 9, 2002

(65) Prior Publication Data

US 2004/0110093 A1    Jun. 10, 2004

(51) Int. Cl.
*G03F 7/004* (2006.01)
*H01L 35/24* (2006.01)

(52) U.S. Cl. .................. 257/40; 257/295; 257/410; 438/99; 438/149; 438/158; 438/216; 438/240; 438/287; 438/785; 438/914; 430/302

(58) Field of Classification Search .......... 257/40, 257/295, 410; 438/99, 149, 158, 216, 240, 438/287, 785, 914; 430/270.1, 302
See application file for complete search history.

(56) References Cited

U.S. PATENT DOCUMENTS

| | | | |
|---|---|---|---|
| 4,743,463 A | 5/1988 | Ronn et al. | 427/53.1 |
| 4,752,455 A | 6/1988 | Mayer | 427/53.1 |
| 4,895,735 A | 1/1990 | Cook | 427/43.1 |
| 4,970,196 A | 11/1990 | Kim et al. | 505/1 |
| 4,987,006 A | 1/1991 | Williams et al. | 427/53.1 |
| 5,725,706 A | 3/1998 | Thoma et al. | 156/150 |

(Continued)

FOREIGN PATENT DOCUMENTS

JP    63143563    6/1988

OTHER PUBLICATIONS

H. Gleskova et al., "*Electrophotographically Patterned Thin-Film Silicon Transistors*", vol. 17, No. 6, p. 264-266, IEEE Electronic Device Letter, Jun. 1996.

(Continued)

*Primary Examiner*—Barbara L. Gilliam
(74) *Attorney, Agent, or Firm*—Ohlandt, Greeley, Ruggiero & Perle, L.L.P.; Robert M. Trepp, Esq.

(57) ABSTRACT

The present invention provides a substrate having thereon a patterned small molecule organic semiconductor layer. The present invention also provides a method and a system for the production of the substrate having thereon a patterned small molecule organic semiconductor layer. The substrate with the patterned small molecule organic semiconductor layer is prepared by exposing a region of a substrate having thereon a film of a precursor of a small organic molecule to energy from an energy source to convert the film of a precursor of a small organic molecule to a patterned small molecule organic semiconductor layer.

31 Claims, 3 Drawing Sheets

U.S. PATENT DOCUMENTS

| | | | |
|---|---|---|---|
| 5,854,139 A * | 12/1998 | Aratani et al. | 438/780 |
| 5,946,511 A | 8/1999 | Balling et al. | 396/401 |
| 5,981,970 A | 11/1999 | Dimitrakopoulos et al. | 257/40 |
| 6,025,110 A | 2/2000 | Nowak | 430/200 |
| 6,036,809 A | 3/2000 | Kelly et al. | 156/247 |
| 6,143,117 A | 11/2000 | Kelly et al. | 156/233 |
| 6,150,668 A * | 11/2000 | Bao et al. | 257/40 |
| 6,177,151 B1 | 1/2001 | Chrisey et al. | 427/596 |
| 6,194,119 B1 | 2/2001 | Wolk et al. | 430/200 |
| 6,207,472 B1 | 3/2001 | Callegari et al. | 438/99 |
| 6,291,116 B1 | 9/2001 | Wolk et al. | 430/200 |
| 6,291,126 B2 | 9/2001 | Wolk et al. | 430/200 |
| 6,402,866 B1 | 6/2002 | Casey et al. | 156/89.12 |
| 6,405,013 B2 | 6/2002 | Haneda et al. | 399/330 |
| 6,855,949 B2 * | 2/2005 | De Leeuw et al. | 257/40 |
| 2002/0015907 A1 | 2/2002 | Wolk et al. | 430/200 |
| 2002/0053320 A1 | 5/2002 | Duthaler et al. | 118/249 |
| 2003/0136964 A1* | 7/2003 | Afzali-Ardakani et al. | 257/72 |
| 2003/0144562 A1* | 7/2003 | Afzali-Ardakani et al. | 570/212 |
| 2004/0106005 A1* | 6/2004 | Hamada et al. | 428/690 |
| 2004/0108047 A1* | 6/2004 | Afzali-Ardakani et al. | 156/230 |
| 2004/0119073 A1* | 6/2004 | Ardakami et al. | 257/72 |

OTHER PUBLICATIONS

Brown et al., "*Precursor Route Pentacene Metal-Insulator-Semiconductor field-Effect*", American Institute of Physics, Feb. 15, 1996.

Y. Y. Lin et al., "*Pentacene-Based Organic Thin-Film Transistors*", vol. 44, No. 8, p. 1325-1331, IEEE Transactions on Electron Devices, Aug. 1997.

Y. Y. Lin et al., "*High-Mobility Pentacene Organic Thin Film Transistors*", 54th Device Research Conference Digest, p. 80-81, Jun. 1996.

Y. Y. Lin et al., "*High-Mobility Pentacene Organic Thin Film Transistors*", 55th Device Research Conference Digest, p. 60-61, Jun. 1997.

Bao et al., "*Soluble and Processable Regioregular Ply (3 Hexylthiophene) for Thin Film Field-Effect Transistor Applications With High Mobility*", American Institute of Physics, Dec. 23, 1996.

Garnier et al., "*Structural Basis for High Carrier Mobility in Conjugated Oligomers*", The Materials Science of Conductive Polymers, Atlanta, GA, Apr. 19, 1991.

Klauk et al., "*Pentacene Organic Thin-Film Transistors and Ics*", www.solid-state.com, p. 63-76, Mar. 2000.

Dimitrakopoulos et al., "*Molecular Beam Deposited thin Films of Pentacene for Organic Field Effect Transistor Applications*", American Institute of Physics, Aug. 1996.

Bao et al., "*Organic Field-Effect Transistors with High Mobility Based on Copper Phthalocyanine*", American Institute of Physics, Nov. 11, 1996.

* cited by examiner

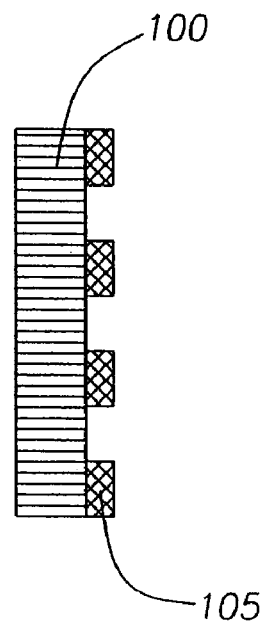
Fig. 1
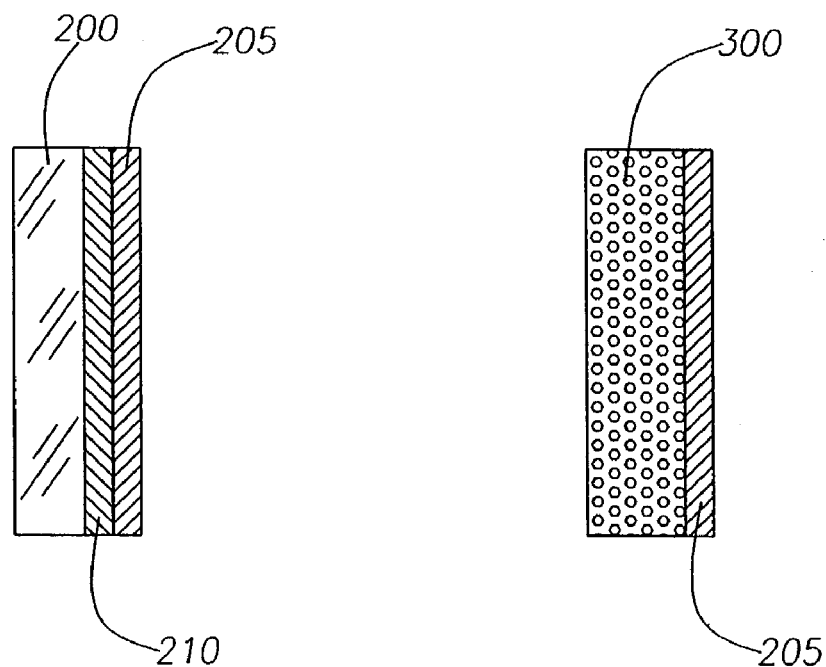
Fig. 2
Fig. 3

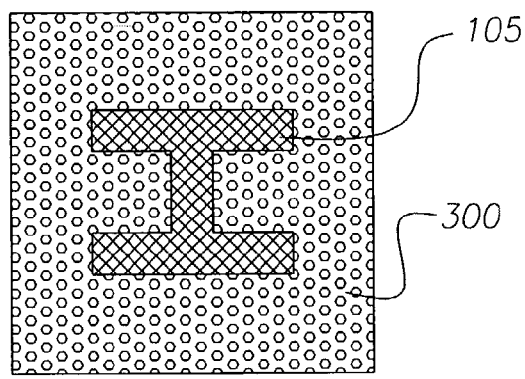
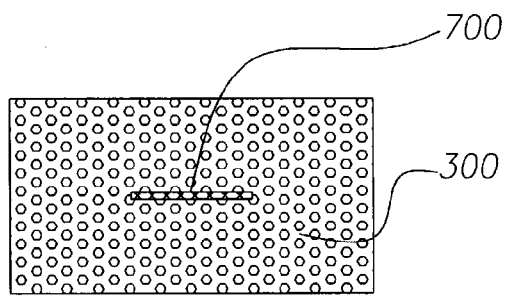
Fig. 6  Fig. 7
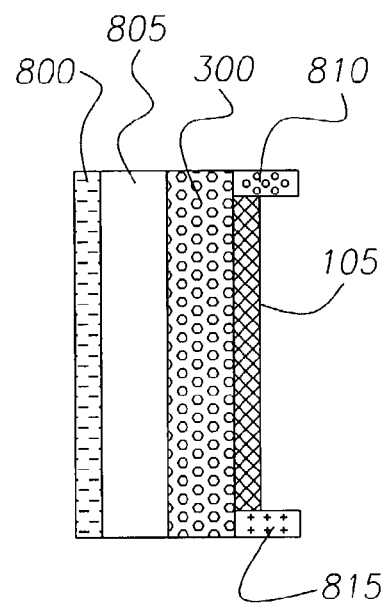
Fig. 8

USE OF AN ENERGY SOURCE TO CONVERT PRECURSORS INTO PATTERNED SEMICONDUCTORS

BACKGROUND OF THE INVENTION

This application is related to commonly owned U.S. Application entitled "A System and Method of Transfer Printing an Organic Semiconductor," Ser. No. 10/314,632, filed herewith on the same day, cross-referenced and incorporated herein by reference. This application is also related to the commonly owned U.S. Application entitled "Synthesis and Application of Photosensitive Pentacene Precursor in Organic Thin Film Transistors," Ser. No. 10/323,899, filed Dec. 20, 2002.

1. Field of the Invention

The present invention relates to a substrate having thereon a small molecule organic semiconductor layer. The present invention also relates to methods and systems for the production of such substrates having patterned small molecule organic semiconductor layers thereon. The patterned small molecule organic semiconductor layer is formed by heating a predeposited precursor of an organic small molecule residing on a substrate. More particularly, the present invention relates to a substrate having thereon a pentacene semiconductor layer.

2. Description of the Prior Art

Thin-film transistors and other electronic devices using organic semiconductors are emerging as alternatives to established methods using amorphous silicon (α-Si:H) as the semiconductor.

A variety of organic compounds have been proposed and tested as semiconducting materials for thin film transistor (TFT) devices. For example, among the p-channel (hole transport) materials that have been characterized are thiophene oligomers proposed as organic semiconductor material for TFT in Garnier, F., et al., "Structural basis for high carrier mobility in conjugated oligomers" Synth. Meth., Vol. 45, p. 163 (1991), and phthalocyanines described in Bao, Z., et al., "Organic Field-effect transistors with high mobility based on copper phthalocyanine" Appl. Phys. Lett., Vol. 69, p. 3066 (1996). Pentacene, which is a member of poly(acene) compounds has been proposed as an organic semiconductor material in Lin et al. IEEE 54th Annual Device Research Conference, 1996, pages 2136–2139, and Dimitrakopoulos et al., J. Appl. Phys. Vol. 80 (4), 1996, pages 2501–2507.

Some soluble organic compounds have also been characterized as organic semiconducting materials. For example poly(3-alkylthiophene) described in Bao, Z., et al., "Soluble and Processable regioregular poly(3-hexylthiophene) for thin film field-effect transistors application with high mobility" Appl. Phys. Lett., Vol. 69, page 4108 (1996).

An attractive material would have a high carrier mobility which is close to that of amorphous silicon (0.1–1 $cm^2$. $V^{-1}.Sec^{-1}$), with a very high on/off ratio (>$10^5$). For an organic material to replace amorphous silicon, not only would it have the electrical properties cited above but also it should be processable from solution so that it could become commercially attractive.

Among the organic compounds which have been studied as semiconductors, only regioregular poly(3-hexylthiophene) is readily soluble in organic solvents and thin films of this compound have been processed from solution for construction of TFTs. The drawback of this compound is that it has relatively low ($5\times10^{-2}$ $cm^2.V^{-1}.s.^{-1}$) carrier mobility and even much less satisfactory on/off ratio of less than 100. In addition, because thin films of this polymer are not stable in air and their field-effect characteristics deteriorate on exposure to air, its application as a semiconductor becomes less desirable.

The best performance as a semiconductor among organic materials to date has been achieved by thin films of pentacene deposited under high vacuum and temperature as reported by Dimitrakopoulos et al., in U.S. Pat. Nos. 5,946,511; 5,981,970 and 6,207,472 and other publications by Brown et al., J. Appl. Phys. 80(4), 1996, pages 2136–2139 and Dimitrakopoulos et al., J. Appl. Phys. 80 (4), pages 2501–2507.

Recently, thin-film transistors on plastic substrates using evaporated films of pentacene as the p-channel carrier with mobility of 1.7 $cm^2.V^{-1}.s.^{-1}$ and an on/off ratio of $10^8$ have been reported by Jakson et al., in Solid State Technology, Vol. 43 (3), 2000, pages 63–77.

Thin films of pentacene are very stable in air and even moderate temperatures and as far as performance is concerned, pentacene is the most attractive organic material to replace amorphous silicon.

The drawback up to now for pentacene is that it is insoluble in common organic solvents and it can only be deposited as a thin film by expensive high vacuum and temperature techniques.

There has been very little effort for the synthesis of soluble pentacene derivatives and the only example of soluble pentacene known to us is by Muellen, K. et al., "A soluble pentacene precursor: Synthesis, solid-state conversion into pentacene and application in a field-effect transistor," Adv. Mat. 11(6), p. 480 (1999), in which a precursor of pentacene is synthesized by a tedious multi-step synthetic approach. The derivative, which is soluble in organic compounds and can be processed from solution, is converted back to pentacene by heating at moderate temperatures (140–200° C.).

The drawback in using this compound as a pentacene precursor is that due to multi-step synthesis (more than 9 steps), its preparation, especially in large a scale, is almost impractical. In addition, its conversion to pentacene occurs at a relatively high temperature, which prevents the use of most plastics as substrates.

Commonly owned and copending application entitled "Hetero Diels-Alder Adducts of Pentacene as Soluble Precursors of Pentacene," Ser. No. 10/300,645, Filed on Nov. 20, 2002, contents of which are incorporated herein by reference, describes a specially prepared pentacene precursor that can be spun, dipped, or sprayed onto a substrate from which a small molecule organic semiconductor can result from simple thermal processing of the precursor. The precursor, after application to a substrate, is then allowed to dry. Upon heating the substrate (upon which the dried precursor film resides) on a hot plate at temperatures of 200° C. or less for several minutes or less the precursor has been shown to transform into a pure small molecule organic semiconductor, such as pentacene. Commonly owned application entitled "Thin Film Transistors Using Solution Processed Pentacene Precursor as Organic Semiconductor," Ser. No. 10/300,630, filed on Nov. 20, 2002, and issued as U.S. Pat. No. 6,963,080, contents of which are incorporated herein by reference, describes the application of a solution processed polycyclic aromatic compound precursors as an organic semiconducting material in thin film transistors.

The identity of the film after thermal processing has been verified as the small molecule organic semiconductor by infrared reflectance-absorption spectroscopy. With a localized or focused heat or energy source that can move relative to the precursor deposited on an energy absorbing substrate, a patterned small molecule organic semiconductor layer can be obtained. An ideal heat or energy source to produce the heat required for patterning is a scannable focused laser with the light absorbed by an energy absorbing film, such as a thin film, in contact with the precursor or an energy absorbing substrate onto which the precursor has been deposited where the substrate is light absorbing.

Yet another configuration is one in which the precursor is separated from the absorbing substrate by a thin transparent or non-energy absorbing film, for example a silicon dioxide film on the order of up to several thousand Angstroms. The energy absorbing film or substrate rapidly transfers the heat due to the absorbed energy to the precursor. The portion of the precursor not exposed to the energy (light)/heat source is rinsed off with a solvent such as ether, leaving only the patterned small molecule organic semiconductor. Depending on the desired feature size, the appropriate focal spot size of the energy and scanning range can be adjusted.

Other energy sources can also be used such as electron beams, miniature thermal heaters, etc. although lasers are a preferred energy source for precursor patterning. Previous art has described the use of a laser to amorphize and crystallize pentacene for use as an optical memory but not derived from a precursor nor used for maskless produced channel regions for semiconductor devices (U.S. Pat. No. 5,707,779).

Printing and stamping of semiconductors has also been disclosed for production of semiconductor devices such as FET's. U.S. patent application Ser. No. 2002/0022299 A1 discloses Means for preparing an organic layer from a water soluble photosensitive organic layer. In that invention the desired patterning of the semiconductor is in part the result of using an aqueous based developer to selectively remove unexposed regions for producing the desired patterning. These features and procedures of this cited application are not claimed as part of the present invention.

Accordingly, it is an object of the present invention to overcome the problems of the prior art by providing a method and system for producing a maskless patterned small molecule organic semiconductor layer on a substrate from a precursor of the small molecule organic semiconductor.

The present invention provides a method of producing a substrate with a patterned small molecule organic semiconductor layer from a precursor with dimensions as small as one micron in width. These large crystallite semiconductor layers have relatively large mobilities. The resulting semiconducting patterning capability has applications in photonic and microelectronic devices such as organic photodiodes and organic light emitting diodes.

SUMMARY OF THE INVENTION

The present invention provides a method of preparing a substrate having thereon a patterned small molecule organic semiconductor layer. The substrate with the patterned small molecule organic semiconductor layer is prepared by exposing a region of a substrate having thereon a film of a precursor of a small organic molecule to energy or other local means of heating from an energy source to convert the film of a precursor of a small organic molecule to a patterned small molecule organic semiconductor layer.

The present invention further provides a substrate having thereon a patterned small molecule organic semiconductor layer. The substrate with the patterned small molecule organic semiconductor layer is prepared by exposing a region of a substrate having thereon a film of a precursor of a small organic molecule to energy from an energy source to convert the film of a precursor of a small organic molecule to a patterned small molecule organic semiconductor layer.

The present invention still further provides a system for producing a substrate having thereon a patterned small molecule organic semiconductor layer. The substrate with the patterned small molecule organic semiconductor layer is prepared by exposing a region of a substrate having thereon a film of a precursor of a small organic molecule to energy from an energy source to convert the film of a precursor of a small organic molecule to a patterned small molecule organic semiconductor layer.

BRIEF DESCRIPTION OF THE DRAWINGS

FIG. 1 shows a substrate having thereon a patterned small molecule organic semiconductor layer.

FIG. 2 shows a system incorporating a substrate of energy transparent material having thereon a film of a precursor of a small organic molecule with an energy absorbing film interposed between the two.

FIG. 3 shows a system incorporating a substrate of energy absorbing material having thereon a film of a precursor of a small organic molecule.

FIG. 6 shows a top view of a substrate having a patterned small molecule organic semiconductor layer in the shape of an "H" resulting from scanned laser heating of the precursor.

FIG. 7 shows a top view of a substrate having a large single crystallite patterned small molecule organic semiconductor layer.

FIG. 8 shows a substrate with the elements of a field effect transistor (FET) thereon and a patterned small molecule organic semiconductor layer deposited as the channel of the FET.

DETAILED DESCRIPTION OF THE INVENTION

Figure 4A:
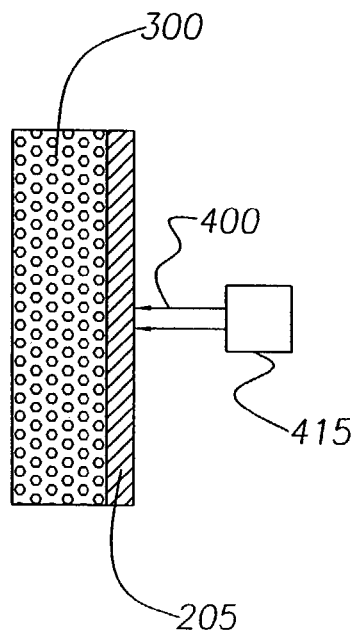
FIG. 4(a) shows energy incident upon an energy absorbing substrate with a film of a precursor of a small organic molecule thereon. The substrate is exposed to the energy on the surface containing the film of a precursor of a small organic molecule.

The present invention provides a substrate having thereon a patterned small molecule organic semiconductor layer. The substrate with the patterned small molecule organic semiconductor layer is prepared by exposing a region of a substrate having thereon a film of a precursor of a small organic molecule to energy, such as localized heat, from an energy source to convert the film of a precursor of a small organic molecule to a patterned small molecule organic semiconductor layer. FIG. 1 shows a sectional view of a substrate 100 having thereon a patterned small molecule organic semiconductor layer 105. The invention further provides a method and a system for producing a substrate having thereon a patterned small molecule organic semiconductor layer.

The film, such as a thin film, of a precursor of a small organic molecule is made up of a precursor that is preferably a Diels-Alder adduct of a polycyclic aromatic compound with a dienophile. Heat is created by the absorption of the energy by an energy absorbing substrate or by an energy absorbing film that is between an energy transparent substrate and the film of a precursor of a small organic molecule. That heat is rapidly transferred from the substrate or energy absorbing film to the film of a precursor of a small organic molecule. This causes the conversion of the precursor to its corresponding small organic molecule. The small organic molecules of this invention are organic semiconducting small molecules such as polycyclic aromatic compounds. Pentacene is a preferred, but non-limiting, example of the small organic molecules that can be utilized in this invention. The small organic molecules that result from the conversion of the precursor form a patterned small molecule organic semiconductor layer.

In the situation where not all of the precursor of the small organic molecule is converted to the small organic molecule as part of the patterned small molecule organic semiconductor layer, the unconverted precursor can be selectively removed by contacting the substrate with a solvent. A preferred solvent is ether.

The substrate can be made of an energy absorbing or an energy transparent material, or a combination of absorbing and transparent materials. The substrate may also contain areas not directly involved with the conversion of the precursor that are neither transparent nor absorptive to energy.

When the substrate is made of an energy transparent material, an energy absorbing film, such as a thin film, can be interposed between the substrate and the film of a precursor of a small organic molecule. In this case the energy passes through the energy transparent material of the substrate and is absorbed by the energy absorbing film, thus producing heat. It is this heat that causes the conversion of the precursor to the patterned small molecule organic semiconductor layer. Non-limiting examples of materials for the energy absorbing film include platinum, titanium, chromium, and organics such as KAPTON™.

FIG. 2 shows a sectional view of a substrate made from a transparent material 200 which has deposited on one of its faces an energy absorbing film 210. The opposite face of this film is covered by a film of a precursor of a small organic molecule 205.

When the substrate is made of an energy absorbing material, the film of a precursor of a small organic molecule is directly on the substrate. In this case the energy is absorbed by the energy absorbing material and heat is produced. It is this heat that causes the conversion of the precursor to the patterned small molecule organic semiconductor layer. FIG. 3 shows a sectional view of a substrate made of an energy absorbing material that has on one of its faces a film of a precursor of a small organic molecule 205.

The substrate can be made of any suitable material. Non-limiting examples of materials that are suitable for use as the substrate include glass, silicon, polyimide, and polymethyl methacrylate (PMMA).

The energy absorbing film can be of a thickness of from about 50 to about 20,000 Angstroms. The energy absorbing film can be applied to the substrate by any well known process. Non-limiting examples of application methods include sputtering, evaporating, spraying, dipping, spin coating, or combinations thereof.

The film of a precursor of a small organic molecule can be applied to the substrate by any suitable method. Non-limiting examples of methods for applying the film of a precursor of a small organic molecule to the substrate include sputtering, evaporating, spraying, dipping, spin coating, or combinations thereof. While spinning is a preferred embodiment, it should be obvious to those skilled in the art that the substrate can also be dipped in a precursor solution to provide a film on the substrate with proper adjustment of the viscosity of the precursor solution.

In the context of the present invention, the term small organic molecule refers to a non-polymeric organic semiconducting material which is a solid. Examples of such small organic molecules include polycyclic aromatic compounds, such as oligothiophene, perylene, benzo[ghi]perylene, coronene and polyacene.

The patterned small molecule organic semiconductor layer is produced by at least a partial conversion of the precursor. Such precursors include a Diels-Alder adduct of a polycyclic aromatic compound with a dienophile, wherein the polycyclic aromatic compound is selected from: oligothiophene, perylene, benzo[ghi]perylene, coronene and polyacene; and wherein the dienophile is represented by the formula:

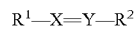

wherein each X and Y can independently be N or $CR^7$;

wherein $R^1$—X═ can be O, S, SO and $SO_2$; and wherein each $R^1$, $R^2$ and $R^7$ can independently be hydrogen, alkyl of 1–12 carbon atoms, aryl, substituted aryl, aralkyl, alkoxycarbonyl, aryloxycarbonyl, acyl and a group R, wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8CO$— wherein $R^8$ can be hydrogen, alkyl of 1–12 carbon atoms, aryl, substituted aryl, aralkyl and fluoroalkyl;

with the proviso that at least one of X and Y is a hetero atom selected from: N, O and S.

A preferred Diels-Alder adduct of a polycyclic aromatic compound with a dienophile is represented by the formula:

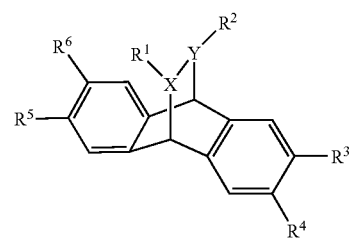

wherein each X and Y is independently selected from: N and $CR^7$;

wherein $R^1$—X= can be O, S, SO and $SO_2$; and wherein each $R^1$, $R^2$ and $R^7$ is independently selected from: hydrogen, alkyl of 1–12 carbon atoms, aryl, substituted aryl, aralkyl, alkoxycarbonyl, aryloxycarbonyl, acyl and a group R, wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8CO$— wherein $R^8$ can be hydrogen, alkyl of 1–12 carbon atoms, aryl, substituted aryl, aralkyl and fluoroalkyl;

with the proviso that at least one of X and Y is a hetero atom selected from: N, O and S.

The Diels-Alder adduct of a polycyclic aromatic compound with a dienophile can be prepared by a process comprising the step of contacting:

(a) a polycyclic aromatic compound selected from: oligothiophene, perylene, benzo[ghi]perylene, coronene and a compound represented by the formula:

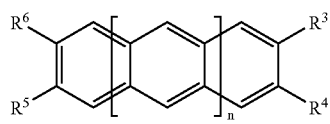

wherein each $R^3$, $R^4$, $R^5$ and $R^6$ is independently selected from: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings, wherein n is at least 1; and (b) dienophile represented by the formula:

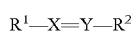

wherein $R^1$, $R^2$, X, and Y have the same meaning as described herein above;

wherein the contacting is carried out under reaction conditions sufficient to produce the Diels-Alder adduct.

A film, such as a thin film, of a Diels-Alder adduct of a polycyclic aromatic compound with a dienophile can be prepared by a method comprising the steps of:

(a) applying onto a substrate a solution of a Diels-Alder adduct of a polycyclic aromatic compound with a dienophile in a suitable solvent, wherein the polycyclic aromatic compound is selected from: oligothiophene, perylene, benzo[ghi]perylene, coronene and a compound represented by the formula:

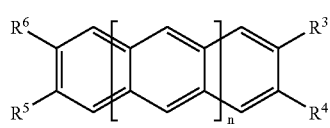

wherein each $R^3$, $R^4$, $R^5$ and $R^6$ is independently selected from: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings, wherein n is at least 1; and wherein the dienophile is represented by the formula:

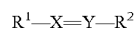

where $R^1$, $R^2$, X, and Y have the same meaning as described herein above; and (b) evaporating the solvent to produce the film of the Diels-Alder adduct of the polycyclic aromatic compound with the dienophile.

A film, such as a thin film, of a polycyclic aromatic compound can be prepared by a method comprising the steps of:

(a) applying onto a substrate a solution of a Diels-Alder adduct of a polycyclic aromatic compound with a dienophile in a suitable solvent, wherein the polycyclic aromatic compound is selected from: oligothiophene, perylene, benzo[ghi]perylene, coronene and a compound represented by the formula:

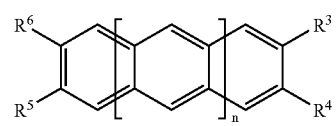

wherein each $R^3$, $R^4$, $R^5$ and $R^6$ is independently selected from: hydrogen, alkyl of 1–12 carbon atoms, aryl, substituted aryl, a group wherein $R^3$ and $R^4$ together form one or more fused benzo rings and a group wherein $R^5$ and $R^6$ together form one or more fused benzo rings, wherein n is at least 1; and wherein the dienophile is represented by the formula:

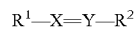

where $R^1$, $R^2$, X, and Y have the same meaning as described herein above;

(b) evaporating the solvent to produce the film of the Diels-Alder adduct of the polycyclic aromatic compound with the dienophile; and (c) heating the film of the Diels-Alder adduct at a temperature and for a period of time sufficient to convert the Diels-Alder adduct back to the polycyclic aromatic compound.

Other fused aromatic compounds like oligothiophene, perylene (III), benzo[ghi]perylene (IV), coronene (V) and other fused aromatic compounds capable of forming Diels-Alder adducts can also be used to prepared soluble precursors of these sparingly soluble compounds.

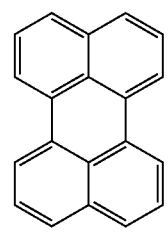

III

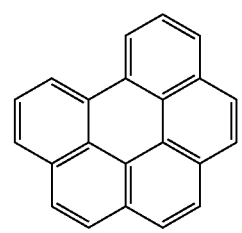

IV

V

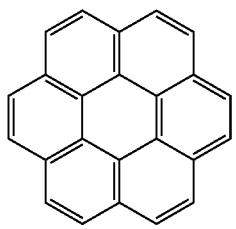

Oligothiophene

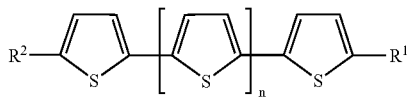

wherein n is equal or greater than 1, and preferably from 1 to 5; and wherein $R^1$ and $R^2$ are independently selected from the group consisting of hydrogen, alkyl of 1–12 carbon atoms, acyl, alkylphosphonate, hydroxyalkyl, mercaptoalkyl, thiol, carboxylic acid, carboxylic acid ester, trialkoxysilane, amino, alkylamino, dialkylamino and aminoalkane.

A most preferred polycyclic aromatic compound is pentacene. Pentacene, a small molecule organic semiconductor is particularly useful in making organic field effect transistors (FET's), as well as organic light emitting diodes. Such organic semiconductors are particularly attractive as they require relatively low temperature processing, the materials are relatively inexpensive and they can be deposited on flexible substrates. These qualities are all advantageous compared to conventional silicon technology as it is employed today in manufacturing of these devices.

An example of such an adduct wherein the polycyclic aromatic compound is pentacene and the dienophile is a thioxocarboxylate is represented by the formula:

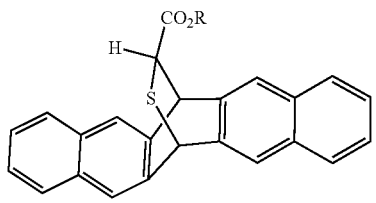

The above Diels-Alder adduct in which the sulfur atom is oxidized to the corresponding sulfoxide is represented by the formula:

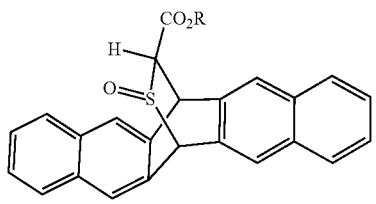

wherein R is selected from: hydrogen, alkyl of 1–12 carbon atoms, alkoxy, acyl, aryl, aralkyl, chloroalkyl, fluoroalkyl and substituted aryl having a substituent selected from: —F, —Cl, —Br, —NO$_2$, —CO$_2$R, —PO$_3$H, —SO$_3$H, trialkylsilyl and acyl; wherein said acyl is represented by the formula: $R^8$CO— wherein $R^8$ is selected from: hydrogen, alkyl of 1–12 carbon atoms, aryl, substituted aryl, aralkyl and fluoroalkyl;

Another example is the Diels-Alder reaction of thioxomalonate with pentacene to form an adduct with one carbon-sulfur bond as depicted in the following scheme. Diethyl thioxomalonate is prepared in situ from the reaction of diethyl oxomalonate and phosphorous pentasulfide and reacted with pentacene in the presence of a catalyst or by heating in pyridine.

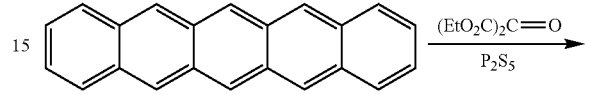

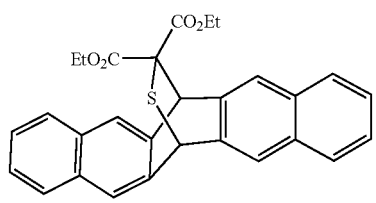

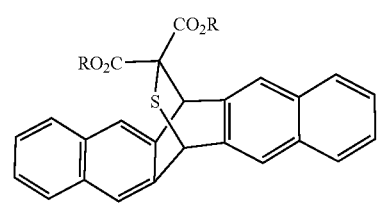

wherein each R is independently selected from: hydrogen, alkyl of 1–12 carbon atoms, alkoxy, acyl, aryl, aralkyl, chloroalkyl, fluoroalkyl and substituted aryl having a substituent selected from: —F, —Cl, —Br, —NO$_2$, —CO$_2$R, —PO$_3$H, —SO$_3$H, trialkylsilyl and acyl; wherein said acyl is represented by the formula: $R^8$CO— wherein $R^8$ is selected from: hydrogen, alkyl of 1–12 carbon atoms, aryl, substituted aryl, aralkyl and fluoroalkyl;

At temperatures higher than 150° C., the thioxomalonate adduct, which is isolated by column chromatography as a white crystalline compound, undergoes a retro Diels-Alder reaction to pentacene. However, if the sulfide is oxidized to corresponding S-oxide, then the adduct can be converted back to pentacene at temperature as low as 150° C.

Both the sulfide and S-oxide adduct are highly soluble in common organic solvents and can be processed from solution to form films, such as thin films, on substrates.

Another class of adducts of pentacene is Diels-Alder reaction products of pentacene and dialkyl or diaralkylazodicarboxylates. These compounds are by themselves thermally labile and decompose above 100° C. Therefore, any Diels-Alder reaction of these compounds with pentacene has to be carried out low to moderate temperature.

The Diels-Alder adduct where the dienophile is an azodicarboxylate of the formula RO—CO—N=N—COOR is shown below:

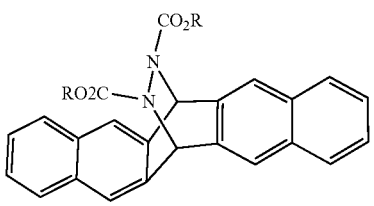

R can be alkyl of 1–12 carbon atoms, aryl, aralkyl, chloroalkyl, fluoroalkyl and substituted aryl having a substituent selected from: —F, —Cl, —Br, —NO$_2$, —CO$_2$R, trialkylsilyl and acyl; wherein the acyl is represented by the formula: R$^8$CO— wherein R$^8$ can be hydrogen, alkyl of 1–12 carbon atoms, aryl, substituted aryl, aralkyl, chloroalkyl and fluoroalkyl.

Preferably, R is benzyl, alkyl of one to five carbon atoms, partially or fully chlorinated alkyl of one to four carbon atoms and partially or fully fluorinated alkyl of one to four carbon atoms.

The above Diels-Alder can be hydrolyzed to form a cyclic diamine compound represented by the formula:

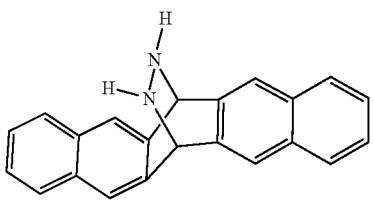

and the diamine can be oxidized to give an azo compound represented by the formula:

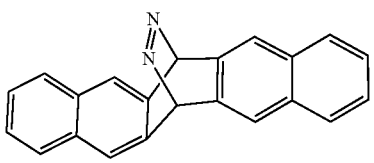

Employing a Lewis acid catalyst, such as, titanium tetrachloride facilitates the Diels Alder reaction so it can be carried out at temperature below −40° C. Alternatively, less active catalysts like silver tetrafluoroborate or methyl rhenium trioxide can be used to run the reaction above room temperature by refluxing the mixture of pentacene, diazodicarboxylate and the catalyst in a low boiling solvent like THF or chloroform.

These diaza adducts of pentacene are stable to high temperatures and as such are not good candidates as pentacene precursors because films of these compounds have to be heated above 280° C. to convert to pentacene. For example, the adduct of diethyl diazodicarboxylate (R=ethyl) has a melting point of 257° C. and is stable up to 300° C. But when the carboxylate groups are hydrolyzed to the corresponding acid, which automatically undergo decarboxylation to form the cyclic diamine, or oxidized form of the latter to diazo derivative, then the adduct becomes highly unstable and can be converted back to pentacene at moderate temperatures (50–100° C.). Thus, an important step in this process is the removal of the carboxylate protecting group at low temperatures so as to be able to isolate the amine or diazo compounds.

The adducts of pentacene with a variety of dialkyl azodicarboxylate were prepared. It was found that bis-trichloroethyl carboxylates (R=CCl$_3$—CH$_2$—) can easily be removed at room temperature in THF by treatment with zinc powder to give the corresponding diamine.

In yet another example of Diels-Alder reaction of pentacene with hetero dienophiles, N-Sulfinyl acetamide (R=CH$_3$CO—) and N-sulfinyl benzyl carbamate (R=C$_6$H$_5$CH$_2$OCO—) were prepared and reacted with pentacene in the presence of methyl rhenium trioxide as Lewis acid catalyst. In both cases, high yields of the adduct were obtained and the compounds found to be highly soluble in many organic solvents.

Films of these compounds were cast from solution and then heated at 120–140° C. to transform the compounds back to pentacene is confirmed by its UV/VIS spectra and thermogravimetric analysis TGA and IR spectrum. Although the onset of the retro Diels-Alder reaction temperature for bulk, as evident from TGA, is about 140° C., films of these compounds can be converted back to pentacene at even lower temperatures of 110–120° C.

In still another example of Diels-Alder reaction of pentacene with hetero dienophiles, a Diels-Alder adduct wherein the dienophile is an N-sulfinyl amide compound is represented by the formula:

RCO—N=S=O and the adduct is represented by the formula:

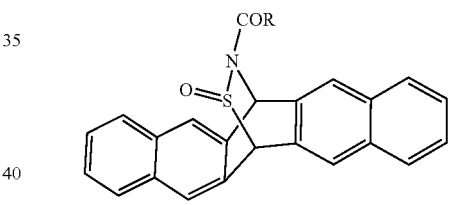

wherein R can be hydrogen, alkyl of 1–12 carbon atoms, alkoxy, acyl, aryl, aralkyl, chloroalkyl, fluoroalkyl and substituted aryl having a substituent selected from: —F, —Cl, —Br, —NO$_2$, —CO$_2$R, —PO$_3$H, —SO$_3$H, trialkylsilyl and acyl; wherein the acyl is represented by the formula: R$^8$CO—wherein R$^8$ can be hydrogen, alkyl of 1–12 carbon atoms, aryl, substituted aryl, aralkyl and fluoroalkyl.

The above Diels-Alder adduct can be hydrolyzed to form a compound represented by the formula:

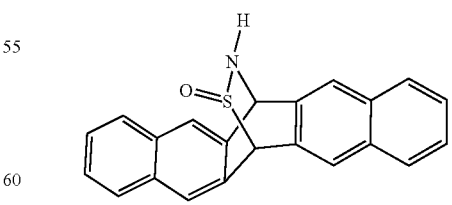

Although only two examples of N-sulfinyl amides are shown here, N-sulfinyl derivatives are equally attractive candidates for the preparation of soluble pentacene adducts.

For example, N-sulfinyl derivative of fluoroalkylamide like trifluoracetamide (R=CF$_3$—CO—) or higher alkyl amides (R=$C_nH_{2n+1}$—CO—, where n=1–10) can be used instead of sulfinyl acetamide. N-Sulfinyl derivatives of aromatic amines (R=aryl) where R— is simply a phenyl group or substituted (nitro, keto, halo, alkyl, fluoroalkyl etc) are known to undergo Diels-Alder reactions and can be used to prepare soluble adducts with pentacene.

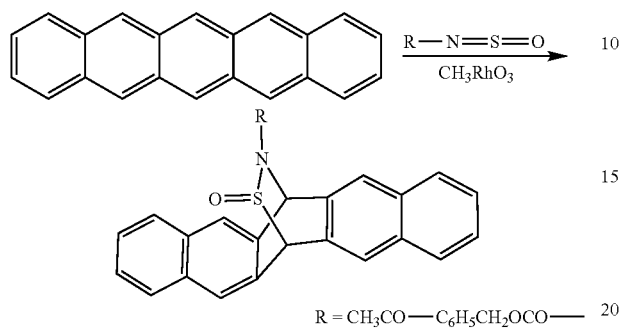

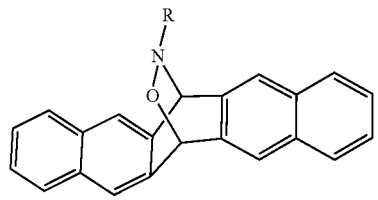

In another example of the Diels-Alder reaction of pentacene with a hetero dienophile, a Diels-Alder adduct wherein the dienophile is a nitroso compound is represented by the formula:

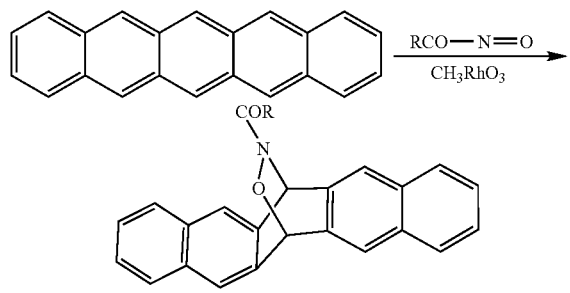

wherein R can be hydrogen, alkyl of 1–12 carbon atoms, alkoxy, acyl, aryl, aralkyl, chloroalkyl, fluoroalkyl, substituted aryl having a substituent selected from: —F, —Cl, —Br, —$NO_2$, —$CO_2R$, —$PO_3H$, —$SO_3H$, trialkylsilyl and acyl; wherein the acyl is represented by the formula: $R^8$CO— wherein $R^8$ can be hydrogen, alkyl of 1–12 carbon atoms, aryl, substituted aryl, aralkyl and fluoroalkyl.

Other acylnitroso compounds of general formula R—CO—N=O are very attractive and judged by its adduct with anthracene derivative can be converted back to pentacene at moderate temperatures. An example would be the reaction of pentacene with N-oxyacetamide (R=$CH_3$—) which can be generated from acetylhydroxamic acid and reacted with pentacene in the presence of methyl rhenium trioxide to give desired adduct as shown bellow.

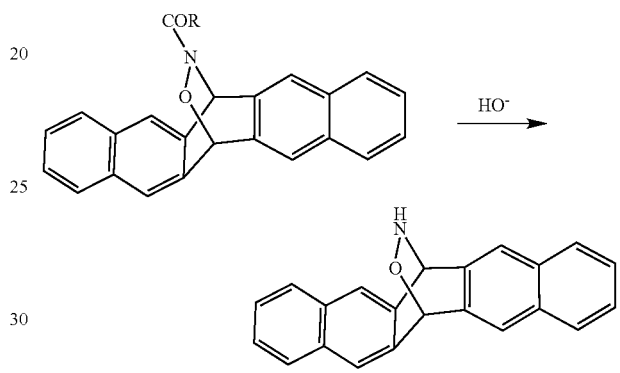

-continued

R = $C_nH_{2n+1}$,

In the above reaction R— can be chosen from alkyl groups of having one to twelve carbon atoms, halogenated alkyl groups like $CF_3$—$(CF_2)_n$— where n is from zero to 10. R could be also an aryl group like phenyl or substituted phenyl with substituents like one or more halogens (Cl, F and Br), nitro group, carboxylic acid or esters, amines or amides, phosphonic acid or ester, trialkyl or trialkoxysilane.

The adducts in which nitrogen is connected to an acyl (RCO) group could further be hydrolyzed to corresponding —NH group by treatment with base as shown in the following reaction.

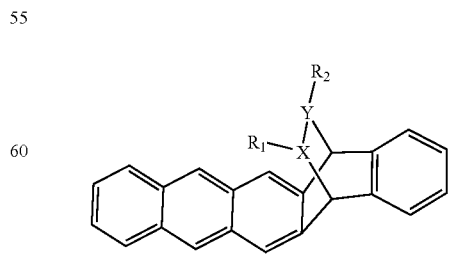

Films of these adducts are prepared from solution by different techniques, e.g., spin-coating, casting, doctor blading, etc. Once films of these adducts on substrates are formed, they can easily be converted back to pentacene by heating the substrate on a hot plate or in an oven at modest temperatures. Any residual compounds other than pentacene formed during retro Diels-Alder reaction can be removed by dipping the substrate solvents like alcohols, ethers, ketones and the like, to get pure pentacene films.

In the examples listed above the diene which was employed in Diels-Alder reactions has been pentacene, but other members of polyacenes like tetracene, hexacene and heptacene (structure I, n=2, 4 and 5 respectively) can also be used to make soluble derivatives with hetero dienophiles.

Although in all the structures depicted so far, the dienophile has attached to the middle ring of pentacene (or polyacene in general) it is possible to have the dienophile react with other ring in polycyclic aromatic compounds like pentacene, as depicted in the following structure with $R^1$—X=Y—$R^2$ representing hetero dienophiles of this invention:

wherein $R^1$, $R^2$, X, and Y have the same meaning as described herein above.

In certain situations, some precursor will remain unconverted on the substrate after exposure to the energy. In these situations the substrate can be annealed after the exposure at about the thermal decomposition temperature of the precursor to convert any remaining precursor of the small organic molecule.

It has also been shown that heating the substrate prior to exposure improves the conversion of the precursor to small organic molecule. Heating is carried out at a temperature in the range from about 25° C. to about 75° C., depending on the particular small organic molecule. This heating can be used alone or in combination with the annealing discussed above.

The energy used to expose the substrate can be selected from any sufficient to cause the conversion of the precursor to small organic molecule. Non-limiting examples of suitable energy from an energy source are infrared, ultraviolet, visible, thermal, electron beam, ion beam, x-ray beam, energy beam, pulsed energy, continuous wave (cw) energy, focused laser, pulsed laser, cw laser, thermal probe, resistive heating, a heated AFM probe, a soldering iron tip, or any combination thereof. A non-limiting example of resistive heating includes resistance losses due to the passage of a local current pulse in contact with the substrate. The energy source can produce energy that exposes small portions of the substrate at a time to the energy. The energy source can optionally produce energy that floods the substrate with energy.

In the current invention the substrate may be moved relative to the energy source. Also, the energy may be moved relative to the substrate. Non-limiting examples of this movement include moving the energy source itself and scanning the energy with respect to the substrate. These movements can be employed singly or in combination. Means for and methods of implementing these movements are well known and one of ordinary skill in the art should be capable of configuring.

A non-limiting embodiment of the invention is shown in FIG. 4a. An energy absorbing substrate 300 has thereon a film of a precursor of a small organic molecule 205. Energy 400 from energy source 415 is incident on the film of a precursor of a small organic molecule 205. The energy 400 penetrates the film of a precursor of a small organic molecule 205 due to the poor absorption properties of 205. The energy 400 is absorbed by the energy absorbing substrate 300. Heat from the absorption of energy 400 is rapidly transferred to the film of a precursor of a small organic molecule 205 causing the conversion of the precursor of a small organic molecule, thus producing a small molecule organic semiconductor layer 105 on a substrate 100 as in FIG. 1.

In another embodiment not shown by the figures, the energy can be incident on the surface of the energy absorbing substrate opposite the film of a precursor of a small organic molecule. The heat transferred from the absorption of the energy by the energy absorbing substrate causes the conversion of the precursor to small organic molecule as in the previous example.

Figure 4B:
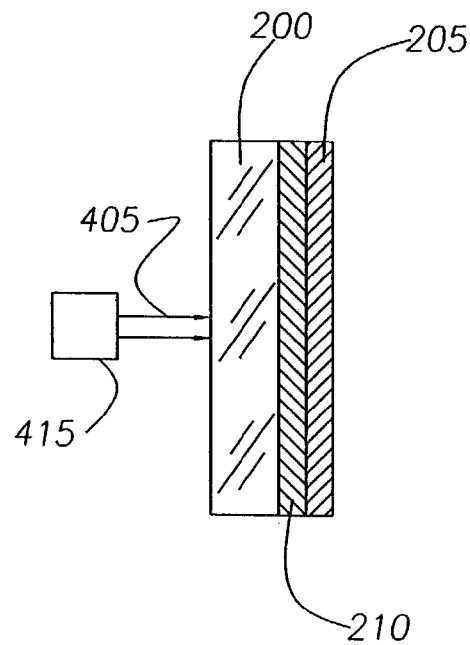
FIG. 4(b) shows energy incident upon an energy transparent substrate with a film of a precursor of a small organic molecule thereon and an energy absorbing film interposed between. The substrate is exposed to the energy on the surface of the substrate opposite to the one containing the film of a precursor of a small organic molecule.

Yet another embodiment of the invention is shown in FIG. 4b. An energy transparent substrate 200 has thereon a film of a precursor of a small organic molecule 205 with an energy absorbing film 210 interposed between the 200 and 205. Energy 405 from energy source is incident on the surface of the energy transparent substrate 200 opposite the film of a precursor of a small organic molecule 205. The energy 405 penetrates the energy transparent substrate 200 and is absorbed by the energy absorbing film 210. Heat from the absorption of energy 400 is rapidly transferred to the film of a precursor of a small organic molecule 205 causing the conversion of the precursor to a small organic molecule, thus producing a small molecule organic semiconductor layer 105 on a substrate 100 as in FIG. 1.

Figure 4C:
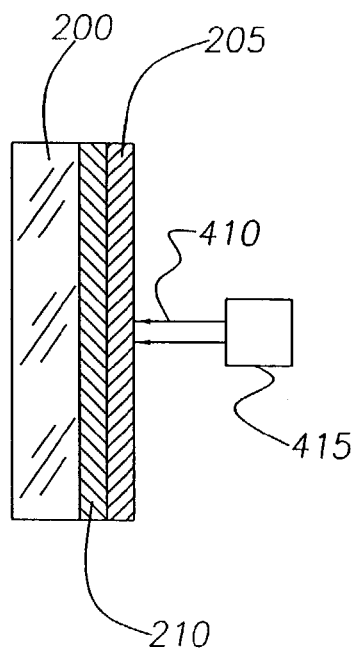
FIG. 4(c) shows energy incident upon an energy transparent substrate with a film of a precursor of a small organic molecule thereon and an energy absorbing film interposed between. The substrate is exposed to the energy on the surface containing the film of a precursor of a small organic molecule.

Still yet another embodiment of the invention is shown in FIG. 4c. An energy transparent substrate 200 has thereon a film of a precursor of a small organic molecule 205 with an energy absorbing film 210 interposed between the 200 and 205. Energy 410 from energy source 415 is incident on the film of a precursor of a small organic molecule 205. The energy 410 penetrates the film of a precursor of a small organic molecule 205 due to the poor absorption properties of 205. The energy 410 is absorbed by the energy absorbing film 210. Heat from the absorption of energy 410 is rapidly transferred to the film of a precursor of a small organic molecule 205 causing the conversion of the precursor to a small organic molecule, thus producing a small molecule organic semiconductor layer 105 on a substrate 100 as in FIG. 1.

It should be noted that in the embodiments of this invention there is a temperature time relationship for the transformation from precursor to small organic molecule to occur. The higher the temperature of the precursor (but below ~200° C. for the pentacene precursor, for example), the shorter the time required for the complete transformation of the precursor to the small organic molecule. Thus, for example, near 200° C. the time for the pentacene precursor to transform to pentacene is only seconds whereas at 50° C. it can take as much as 10–30 minutes. These time limits determine the required duration of exposure to the energy. In the shorter time regime the area of the film of a precursor of a small organic molecule transformed will conform approximately to the area of the thermally heated spot. In the limit of seconds or less, the transformed area is approximately equal to the diameter of the thermal heating caused by the energy. When the energy is a laser, the transformed area would be approximately equal to the diameter of the laser. The confinement of the heat to an area comparable to the diameter of the exposure of energy makes it possible to use moving energy, a moving substrate, or a combination of movements to trace a small organic molecule pattern without the use of a mask, thus creating the small molecule organic semiconductor layer.

Figure 5:
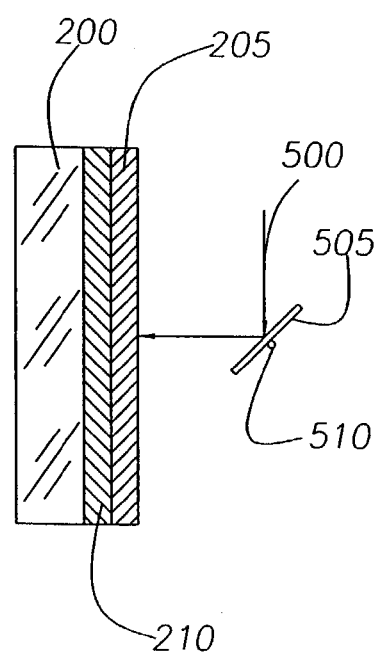
FIG. 5 shows an energy transparent substrate with a film of a precursor of a small organic molecule thereon and an energy absorbing film interposed between. The energy in this model is a focused laser which is scanned using a pivoting mirror.

FIG. 5 shows a non-limiting example of how the energy can be moved relative to the substrate. A laser beam 500 is incident on a scanning mirror 505 shown with an axis of rotation 510 resulting in only a one dimensional scan. This is shown by way of example. A two dimensional scan is simple to facilitate and is well known to those skilled in the art. Laser beam 500 is deflected onto the film of a precursor of a small organic molecule 205. The film of a precursor of a small organic molecule 205 is on an energy transparent substrate 200 with an energy absorbing film interposed between 200 and 205. It should be noted that the energy transparent substrate 200 with the energy absorbing film 205 are used here as non-limiting examples. It should be clear from the many examples above that an energy absorbing substrate could also be used, as well as having the energy incident on the opposite surface.

The laser beam 500 penetrates the film of a precursor of a small organic molecule 205 and is absorbed by the energy absorbing film 210. The resultant heat is transferred to the film of a precursor of a small organic molecule 205 causing the conversion of the precursor to a small organic molecule, thus producing a small molecule organic semiconductor layer 105 on a substrate 100 as in FIG. 1.

FIG. 6 shows an example of the patterned small molecule organic semiconductor layer that can be formed by the methods of this invention. FIG. 6 is a top view of an energy absorbing substrate 300 (shown by way of example) with a small molecule organic semiconductor layer 105 thereon in an "H" pattern.

The use of slowly scanning, highly focused energy, i.e. on the order of 1 micron in diameter, moving at speeds of less than 1 micron/second at an energy flux that is chosen to prevent boiling of the precursor, results in relatively large crystallites of small organic molecule forming the small molecule organic semiconductor layer. The flux depends on the thermal and optical (reflecting) properties of the energy absorbing medium as well as the substrate. It is also possible to obtain better crystallinity by using a chemical alignment layer onto which the precursor is deposited. In the case of single crystals of small organic molecule, there would be no grain boundaries or dislocations and therefore relatively higher mobilities will result compared to that for polycrystalline films. High mobility is especially important for fabricating an organic semiconducting 'channel' for a field effect transistor (FET) which the present invention facilitates and which is a preferred embodiment. When this type of scanning is employed where an FET is on the substrate, the crystallites growth is such that the length exceeds the channel length. The crystallite length may vary from sub-micron to several microns. The scanned energy is most preferred as the result of a focused laser. The focused laser can be scanned in a manner to achieve a maximum temperature gradient between converted and unconverted precursor by controlling the spot diameter of the focused laser, the thermal conductivity of the substrate, and the thermal conductivity of the patterned small molecule organic semiconductor layer. FIG. 7 illustrates a large single crystallite growth 700 of small organic molecule on an energy absorbing substrate 300.

In one embodiment, components to an electronic structure can be added to the substrate. An example of an electronic structure useful in the present invention is a field effect transistor (FET). Components of an FET include source, drain, and gate elements. In this preferred embodiment, the patterned small molecule organic semiconductor layer forms a channel of the field effect transistor (FET). FIG. 8 shows an energy absorbing substrate 300 with gate 800, gate oxide 805, drain 810, and source 815 elements of an FET. A patterned small molecule organic semiconductor layer 105 has been converted by the methods of this invention from a film of a precursor of a small organic molecule. The patterned small molecule organic semiconductor layer forms the channel of the FET.

In another preferred embodiment, the patterned small molecule organic semiconductor layer forms an active layer in an organic light emitting diode. In another preferred embodiment, the components to an electronic structure are components of a photodiode.

It has been found that the production of the patterned small molecule organic semiconductor layer using the methods of this invention is improved when an adhesion layer film or chemical alignment layer is interposed between the energy absorbing film and the film of a precursor of a small organic molecule.

In yet another embodiment, a mask is inserted between the substrate and the energy source. The mask can be used where the energy is in the form of flood illumination. In this situation the mask acts as a physical block to the energy and heating of the film of a precursor of a small organic molecule creating the patterned small molecule organic semiconductor layer. However, the main focus of this invention is to stress the fact that patterning from an organic precursor can be achieved without the use of masks.

In addition to being directed to the method for preparing the substrate having the patterned small molecule organic semiconductor layer thereon, this invention is directed to the substrate with the patterned small molecule organic semiconductor layer comprising a small organic molecule converted from a precursor by exposing a substrate having thereon a film of a precursor of a small organic molecule to energy.

The invention also describes a system for producing the substrate having thereon the patterned small molecule organic semiconductor layer. The system can be utilized in the practice of the method of the invention and all its embodiments. The system includes a substrate having thereon a film of a precursor of a small organic molecule and an energy source positioned to expose a region of the substrate to energy. The energy causes the conversion of the film of a precursor of a small organic molecule to a patterned small molecule organic semiconductor layer to produce the substrate having thereon a patterned small molecule organic semiconductor layer.

The system can also include means for selectively removing any unconverted precursor from the substrate after exposure to energy. A preferred means for removing unconverted precursor is a solvent that is placed in contact with the substrate. A preferred solvent is ether.

In one embodiment of the system, the substrate and the film of a precursor of a small organic molecule have an energy absorbing film interposed between them to absorb the energy and cause the conversion of the precursor to small organic molecule. A preferred energy absorbing film would have a thickness of from about 50 to about 20,000 Angstroms.

The substrate can be made of an energy absorbing or an energy transparent material, or a combination of absorbing and transparent materials. The substrate may also contain areas not directly involved with the conversion of precursor that are neither transparent nor absorptive to energy.

When the substrate is made of an energy absorbing material, the film of a precursor of a small organic molecule is directly on the substrate. In this case, the energy is absorbed by the energy absorbing material and heat is produced. It is this heat that causes the conversion of the film of a precursor of a small organic molecule to the patterned small molecule organic semiconductor layer.

When the substrate is made of an energy transparent material, an energy absorbing film can be interposed between the substrate and the film of a precursor of a small organic molecule. In this case the energy passes through the energy transparent material of the substrate and is absorbed by the energy absorbing film, thus producing heat. It is this heat that causes the conversion of the film of a precursor of a small organic molecule to the patterned small molecule organic semiconductor layer.

The substrate can be made of any suitable material. Non-limiting examples of materials that are suitable for use as the substrate include glass, silicon, polyimide, and polymethyl methacrylate (PMMA).

The energy absorbing film can be of a thickness of from about 50 to about 20,000 Angstroms. The energy absorbing film can be applied to the substrate by any well known process. Non-limiting examples of application methods include sputtering, evaporating, spraying, dipping, spin coating, or combinations thereof.

The film of a precursor of a small organic molecule can also be applied to the substrate by any well known process. Non-limiting examples of application methods include sputtering, evaporating, spraying, dipping, spin coating, or combinations thereof.

As discussed in detail above with relation to the method, the patterned small molecule organic semiconductor layer is produced by at least a partial conversion of the film of a precursor of a small organic molecule.

In those situations where some precursor remains unconverted on the substrate after exposure to energy, the substrate can be annealed after the exposure at about the thermal decomposition temperature of the precursor to convert any remaining precursor to the small organic molecule.

As discussed above, the substrate can be heated prior to exposure to energy.

The energy used to expose the substrate can be selected from any sufficient to cause the conversion of the film of a precursor of a small organic molecule to small organic molecule. Non-limiting examples of suitable energy from an energy source are infrared, ultraviolet, visible, thermal, electron beam, ion beam, x-ray beam, energy beam, pulsed energy, continuous wave (cw) energy, focused laser, pulsed laser, cw laser, thermal probe, resistive heating, a heated AFM probe, a soldering iron tip, or any combination thereof. A non-limiting example of resistive heating includes resistance losses due to the passage of a local current pulse in contact with the substrate. The energy source can produce energy that exposes small portions of the substrate at a time to the energy. The energy source can optionally produce energy that floods the substrate with energy.

The system can include means for moving the substrate relative to the energy source. The system can also include means for moving the energy relative to the substrate. Non-limiting examples of means for moving the energy include means to move the energy source itself or means causing the scanning of the energy, such as a mirror for scanning a focused laser. These means can be employed singly or in combination.

Examples of some of the many variations possible for configuring the system are discussed in detail above with relation to the method.

In one embodiment, a mask is inserted between the substrate and the energy source. The mask can be used where the energy is in the form of flood illumination. In this situation the mask acts as a physical block to the energy and heating of the film of a precursor of a small organic molecule creating the patterned small molecule organic semiconductor layer.

In another embodiment, the patterned small molecule organic semiconductor layer is the channel of a field effect transistor. Other components of the field effect transistor that may be situated in proximity to the substrate include source, drain, and gate elements as described above relative to the methods of the present invention.

In still another embodiment, the patterned small molecule organic semiconductor layer forms an active layer in an organic light emitting diode.

In yet another embodiment, a means suitable to scan the energy at a rate of 1 micron/second or less is used to produce a large crystallite growth of the patterned small molecule organic semiconductor layer. A non-limiting example of a means suitable to scan the energy is scanning mirrors. When this type of scanning is employed where an FET is on the substrate, the crystallites growth is such that the length exceeds the channel length. The crystallite length may vary from submicron to several microns. The scanned energy most preferred is a focused laser. The focused laser can be scanned in a manner to achieve a maximum temperature gradient between converted and unconverted precursor by controlling the spot diameter of the focused laser, the thermal conductivity of the substrate, and the thermal conductivity of the patterned small molecule organic semiconductor layer.

It has been found that the production of the patterned small molecule organic semiconductor layer is improved when an adhesion layer film or chemical alignment layer is interposed between the energy absorbing film and the film of a precursor of a small organic molecule. The system of this invention can further include this adhesion layer film.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. A method of preparing a substrate having thereon a patterned small molecule organic semiconductor layer, said method comprising:

patternwise exposing a region of a substrate having thereon a film of a precursor of a small organic molecule to energy from an energy source to convert said film of a precursor of a small organic molecule to a patterned small molecule organic semiconductor layer to produce said substrate having thereon said patterned small molecule organic semiconductor layer;

wherein said precursor is a Diels-Alder adduct of a polycyclic aromatic compound with a dienophile, wherein said polycyclic aromatic compound is selected from the group consisting of: oligothiophene, perylene, benzo[ghi]perylene, coronene and polyacene; and wherein said dienophile is represented by the formula:

$$R^1\text{---}X\text{=}Y\text{---}R^2$$

wherein X is N or $CR^7$, or X and $R^1$ together form the group $R^1\text{---}X$, wherein $R^1\text{---}X$ is selected from the group consisting of: O, S, SO and $SO_2$;

wherein Y is selected from the group consisting of: N and $CR^7$; and wherein each $R^1$, $R^2$ and $R^7$ is independently selected from the group consisting of: hydrogen, alkyl of 1–12 carbon atoms, aryl, substituted aryl, aralkyl, alkoxycarbonyl, aryloxycarbonyl, acyl and a group R, wherein R is selected from the group consisting of: hydrogen, alkyl of 1–12 carbon atoms, alkoxy, acyl, aryl, aralkyl, chloroalkyl, fluoroalkyl and substituted aryl having a substituent selected from the group consisting of: —F, —Cl, —Br, —$NO_2$, —$CO_2R$, —$PO_3H$, —$SO_3H$, trialkylsilyl and acyl; wherein said acyl is represented by the formula: $R^8CO$— wherein $R^8$ is selected from the group consisting of: hydrogen, alkyl of 1–12 carbon atoms, aryl, substituted aryl, aralkyl and fluoroalkyl.

2. The method of claim 1, further comprising:

contacting said substrate and a solvent to selectively remove any unconverted precursor.

3. The method of claim 2, wherein said solvent is ether.

4. The method of claim 1, wherein said substrate is an energy absorbing material or an energy transparent material.

5. The method of claim 1, wherein said substrate and said film of a precursor of a small organic molecule have an energy absorbing film interposed therebetween.

6. The method of claim 5, wherein said energy absorbing film is applied to said substrate by a process selected from the group consisting of: sputtering, evaporating, spraying, spin coating, dipping, and combinations thereof.

7. The method of claim 1, wherein said energy source is selected from the group consisting of: infrared, ultraviolet, x-ray, visible, thermal, electron beam, ion beam, energy beam, pulsed energy, continuous waver (cw) energy, focused laser, pulsed laser, cw laser, thermal probe, resistive heating, a heated AFM probe, a soldering iron tip, and combinations thereof.

8. The method of claim 1, wherein said film of a precursor of a small organic molecule is applied to said substrate by a process selected from the group consisting of: sputtering, evaporating, spraying, spin coating, dipping, and combinations thereof.

9. The method of claim 1, wherein said energy source is a focused laser.

10. The method of claim 9, wherein said patterned small molecule organic semiconductor layer is a channel portion of a field effect transistor.

11. The method of claim 9, wherein said patterned small molecule organic semiconductor layer forms an active layer in an organic light emitting diode.

12. The method of claim 1, wherein said small organic molecule is pentacene.

13. The method of claim 1, wherein said energy is scanned at a rate of 1 micron/second or less to produce a large crystallite growth of said patterned small molecule organic semiconductor layer.

14. The method of claim 13, wherein said crystallites growth is such that a length of said crystallite growth exceeds a channel length of a field effect transistor.

15. The method of claim 13, wherein said energy is produced by a focused laser.

16. The method of claim 15, wherein said focused laser is scanned in a manner to achieve a maximum temperature gradient between converted and unconverted precursor by controlling the spot diameter of said focused laser, the thermal conductivity of said substrate, and the thermal conductivity of the patterned small molecule organic semiconductor layer.

17. The method of claim 13, wherein said substrate and said film of a precursor of a small organic molecule have an energy absorbing film interposed therebetween.

18. The method of claim 17, wherein said energy absorbing film and said film of a precursor of a small organic molecule have an adhesion layer film interposed therebetween.

19. The method of claim 1, wherein said substrate is heated to a temperature in the range of from about 25° C. to about 75° C. prior to exposing said region of said substrate to said energy.

20. A system for preparing a substrate having thereon a patterned small molecule organic semiconductor layer, said system comprising:
a substrate having thereon a film of a precursor of a small organic molecule; and
an energy source positioned to patternwise expose a region of said substrate to energy;
wherein said energy causes the conversion of said film of a precursor of a small organic molecule to a patterned small molecule organic semiconductor layer to produce said substrate having thereon a patterned small molecule organic semiconductor layer;
wherein said precursor is a Diels-Alder adduct of a polycyclic aromatic compound with a dienophile, wherein said polycyclic aromatic compound is selected from the group consisting of: oligothiophene, perylene, benzo[ghi]perylene, coronene and polyacene; and wherein said dienophile is represented by the formula:

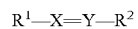

wherein X is N or $CR^7$, or X and $R^1$ together form the group $R^1$—X, wherein $R^1$—X is selected from the group consisting of: O, S, SO and $SO_2$;
wherein Y is selected from the group consisting of: N and $CR^7$; and
wherein each $R^1$, $R^2$ and $R^7$ is independently selected from the group consisting of: hydrogen, alkyl of 1–12 carbon atoms, aryl, substituted aryl, aralkyl, alkoxycarbonyl, aryloxycarbonyl, acyl and a group R, wherein R is selected from the group consisting of: hydrogen, alkyl of 1–12 carbon atoms, alkoxy, acyl, aryl, aralkyl, chloroalkyl, fluoroalkyl and substituted aryl having a substituent selected from the group consisting of: —F, —Cl, —Br, —$NO_2$, —$CO_2R$, —$PO_3H$, —$SO_3H$, trialkylsilyl and acyl; wherein said acyl is represented by the formula: $R^8CO$— wherein $R^8$ is selected from the group consisting of: hydrogen, alkyl of 1–12 carbon atoms, aryl, substituted aryl, aralkyl and fluoroalkyl.

21. The system of claim 20, wherein said substrate having thereon a patterned small molecule organic semiconductor layer is contacted with a solvent to remove any unconverted precursor.

22. The system of claim 21, wherein said solvent is ether.

23. The system of claim 21, wherein said substrate is an energy absorbing material or an energy transparent material.

24. The system of claim 23, wherein said energy absorbing material and said film of a precursor of a small organic molecule have an adhesion layer film interposed therebetween.

25. The system of claim 21, wherein said substrate and said film of a precursor of a small organic molecule have an energy absorbing film interposed therebetween.

26. The system of claim 25, wherein said energy absorbing film is applied to said substrate by a process selected from the group consisting of: sputtering, evaporating, spraying, spin coating, dipping, and combinations thereof.

27. The system of claim 25, wherein said film of a precursor of a small organic molecule is applied to said substrate by a process selected from the group consisting of: sputtering, evaporating, spraying, spin coating, dipping, and combinations thereof.

28. The system of claim 20, wherein said patterned small molecule organic semiconductor layer is a channel portion of a field effect transistor.

29. The system of claim 28, wherein said patterned small molecule organic semiconductor layer forms an active layer in an organic light emitting diode.

30. The system of claim 20, wherein said small organic molecule is pentacene.

31. The system of claim 20, wherein said substrate is heated to a temperature in the range of from about 25° C. to about 75° C. prior to exposing said region of said substrate to said energy.

* * * * *